(12) United States Patent
Nam et al.

(10) Patent No.: US 8,933,861 B2
(45) Date of Patent: Jan. 13, 2015

(54) STEREOSCOPIC IMAGE DISPLAY AND METHOD FOR DRIVING THE SAME

(75) Inventors: Daehyun Nam, Goyang-si (KR); Dosung Kim, Goyang-si (KR); Sunghak Jo, Goyang-si (KR); Seonghun Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 518 days.

(21) Appl. No.: 13/313,815

(22) Filed: Dec. 7, 2011

(65) Prior Publication Data

US 2012/0162206 A1 Jun. 28, 2012

(30) Foreign Application Priority Data

Dec. 24, 2010 (KR) ........................ 10-2010-0134535

(51) Int. Cl.
*G09G 5/00* (2006.01)
*G09G 3/00* (2006.01)
*G09G 3/36* (2006.01)
*G11C 19/28* (2006.01)
*H04N 13/04* (2006.01)
*G09G 3/20* (2006.01)

(52) U.S. Cl.
CPC .............. *G09G 3/003* (2013.01); *G09G 3/3659* (2013.01); *G11C 19/28* (2013.01); *H04N 13/0434* (2013.01); *H04N 13/0452* (2013.01); *H04N 13/0497* (2013.01); *G09G 3/20* (2013.01); *G09G 3/3677* (2013.01); *G09G 2300/0426* (2013.01); *G09G 2300/0443* (2013.01); *G09G 2310/0267* (2013.01); *G09G 2310/0286* (2013.01); *G09G 2310/08* (2013.01)
USPC .................... 345/6; 345/92; 345/94; 345/204; 348/42; 348/51

(58) Field of Classification Search
CPC ............ H04N 13/026; H04N 13/0044; H04N 13/0452
USPC ........... 345/51, 76, 87–89, 92, 100, 204, 211, 345/419, 609, 694, 94, 6; 348/42, 51
See application file for complete search history.

(56) References Cited

U.S. PATENT DOCUMENTS

| | | | | |
|---|---|---|---|---|
| 7,961,171 B2 * | 6/2011 | Miyasaka et al. | ............. | 345/104 |
| 8,243,059 B2 * | 8/2012 | Lai et al. | ........................ | 345/214 |
| 8,462,096 B2 * | 6/2013 | Otose | ............................. | 345/100 |
| 8,493,440 B2 * | 7/2013 | Krijn et al. | ...................... | 348/59 |
| 8,638,359 B2 * | 1/2014 | Kim et al. | ........................ | 348/51 |
| 2007/0273630 A1 * | 11/2007 | Lee | ................... | 345/92 |
| 2010/0265230 A1 * | 10/2010 | Kang | ............................. | 345/211 |
| 2012/0032949 A1 * | 2/2012 | Lim et al. | ...................... | 345/419 |
| 2012/0307959 A1 * | 12/2012 | Furuta et al. | ..................... | 377/64 |

\* cited by examiner

*Primary Examiner* — Kevin M Nguyen
*Assistant Examiner* — Mansour M Said
(74) *Attorney, Agent, or Firm* — Brinks Gilson & Lione

(57) ABSTRACT

Embodiments of the invention relate to a stereoscopic image display and a method for driving the same. Stereoscopic image display includes a data display unit including a first scan transistor, an active black stripe unit including a second transistor and a third transistor, and a shift register sequentially supplying the gate pulse to each of (2n−1)th gate lines and (2n)th gate lines, where n is a natural number. The first scan transistor supplies a data voltage to a pixel electrode in response to a gate pulse of a (2n−1)th gate line, the second transistor supplies the data voltage to the pixel electrode in response to the gate pulse of the (2n−1)th gate line, and the third transistor supplies a low logic level voltage or a common voltage to the pixel electrode in response to a gate pulse of a (2n)th gate line.

12 Claims, 13 Drawing Sheets

STEREOSCOPIC IMAGE DISPLAY AND METHOD FOR DRIVING THE SAME

Pursuant to 35 U.S.C. §119(a), this application claims the benefit of earlier filing date and right of priority to Korean Application 10-2010-0134535 filed on Dec. 24, 2010, the content of which is incorporated by reference herein in its entirety.

BACKGROUND

1. Field of the Invention

Embodiments of the invention relate to a stereoscopic image display and a method for driving the same.

2. Discussion of the Related Art

A stereoscopic image display implements a three-dimensional (3D) image using a stereoscopic technique or an autostereoscopic technique. The stereoscopic technique, which uses a parallax image between left and right eyes of a user with a high stereoscopic effect, may include a glasses type method and a non-glasses type method. In the glasses type method, a stereoscopic image is implemented on a direct-view display or a projector using polarization glasses by varying a polarization direction of the parallax image between the left and right eyes. Alternatively, the stereoscopic image is implemented on the direct-view display or the projector using liquid crystal shutter glasses by displaying the parallax image between the left and right eyes in a time-division manner. In the non-glasses type method, an optical part such as a parallax barrier and a lenticular lens for separating an optical axis of the parallax image between the left and right eyes is generally installed in front of or behind a display screen, and thus the stereoscopic image is implemented.

FIG. 1 illustrates a related art patterned retarder type stereoscopic image display. As shown in FIG. 1, the patterned retarder type stereoscopic image display implements a 3D image using polarization characteristic of a patterned retarder 5 disposed on a display panel 3 and polarization characteristic of polarization glasses 6 a user wears. The patterned retarder type stereoscopic image display displays a left eye image L and a right eye image R on adjacent lines of the display panel 3 and switches polarization characteristics of light incident on the polarization glasses 6 through the patterned retarder 5. The patterned retarder type stereoscopic image display allows polarization characteristic of the left eye image L to be different from polarization characteristic of the right eye image R and spatially divides the left eye image L and the right eye image R the user sees, thereby implementing the 3D image. In FIG. 1, a reference numeral 1 denotes a backlight unit providing light to the display panel 3, and reference numerals 2 and 4 denote polarizing films, that are respectively attached to an upper substrate and a lower substrate of the display panel 3 so as to select linear polarization.

In the patterned retarder type stereoscopic image display shown in FIG. 1, visibility of the 3D image is degraded because of a crosstalk generated at a position of a vertical viewing angle. The user's left eye has to transmit only light of the left eye image L and the user's right eye has to transmit only light of the right eye image R, so that the user can sufficiently feel a stereoscopic feeling of the 3D image. However, when both the light of the left eye image L and the light of the right eye image R are incident on the user's left and right eyes, the user sees both the light of the left eye image L and the light of the right eye image R through the user's left or right eye, thereby perceiving the crosstalk. When the user does not view the 3D image in the front of the display panel 3 and looks down or up the 3D image, the crosstalk is generated at the vertical viewing angle, that is equal to or greater than a predetermined angle. Thus, the related art patterned retarder type stereoscopic image display has the very narrow vertical viewing angle at which the user can view the 3D image without the crosstalk.

Thus, as shown in FIG. 2, Japanese Laid Open Publication No. 2002-185983 discloses a method for widening an vertical viewing angle of a stereoscopic image display by forming black stripes BS in a patterned retarder 5. When the user observes the stereoscopic image display at a location spaced apart from the stereoscopic image display by a predetermined distance D, an vertical viewing angle α, at which the crosstalk is not theoretically generated, depends on the size of black matrixes BM of a display panel 3, the size of the black stripes BS of the patterned retarder 5, and a distance S between the display panel 3 and the patterned retarder 5. The vertical viewing angle a widens as the size of the black matrixes BM and the size of the black stripes BS increase and as the distance S between the display panel 3 and the patterned retarder 5 decreases.

However, a luminance of the stereoscopic image display including the black stripes BS formed in the patterned retarder 5 is much less than a luminance of the existing display device displaying only a two-dimensional (2D) image because of the black stripes BS. Further, the stereoscopic image display including the black stripes BS formed in the patterned retarder 5 requires the precision alignment when the patterned retarder 5 is attached to the display panel 3. When the patterned retarder 5 is not accurately aligned, operations of the black stripes BS are not smoothly performed. Therefore, the user may view the left eye image through his/her right eye or may view the right eye image through his/her left eye. As a result, the user may perceive the crosstalk. Thus, a technology for controlling pixels of the display panel using active black stripes has been proposed, so as to solve the problems of the stereoscopic image display disclosed in Japanese Laid Open Publication No. 2002-185983.

BRIEF SUMMARY

A stereoscopic image display includes a data display unit including a first scan transistor, the first scan transistor supplying a 2D data voltage of a data line to a pixel electrode in response to a gate pulse of a (2n−1)th gate line in a 2D mode and supplying a 3D data voltage of the data line to the pixel electrode in response to the gate pulse of the (2n−1)th gate line in a 3D mode, where n is a natural number, an active black stripe unit including a second transistor and a third transistor, the second transistor supplying the 2D data voltage of the data line to the pixel electrode in response to the gate pulse of the (2n−1)th gate line in the 2D mode and supplying the 3D data voltage of the data line to the pixel electrode in response to the gate pulse of the (2n−1)th gate line in the 3D mode, the third transistor being turned off in response to a low logic level voltage of a (2n)th gate line in the 2D mode and supplying a common voltage commonly applied to a common electrode to the pixel electrode in response to a gate pulse of the (2n)th gate line in the 3D mode, and a shift register including A-stages sequentially supplying the gate pulse to the (2n−1)th gate lines and B-stages sequentially supplying the gate pulse to the (2n)th gate lines.

In another aspect, there is a method for driving a stereoscopic image display including supplying a 2D data voltage of a data line to a pixel electrode of a data display part and a pixel electrode of a active black stripe part in response to a gate pulse of a (2n−1)th gate line in a 2D mode, where n is a natural number; supplying a 3D data voltage of the data line to the pixel electrode of the data display part and the pixel electrode of the active black stripe part in response to the gate pulse of the (2n−1)th gate line in a 3D mode; supplying a common voltage commonly applied to a common electrode to the pixel electrode in response to a gate pulse of the (2n)th gate line in the 3D mode; and sequentially supplying the gate pulse to the (2n−1)th gate lines and sequentially supplying the gate pulse to the (2n)th gate lines.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE DRAWINGS AND THE PRESENTLY PREFERRED EMBODIMENTS

Figure 1:
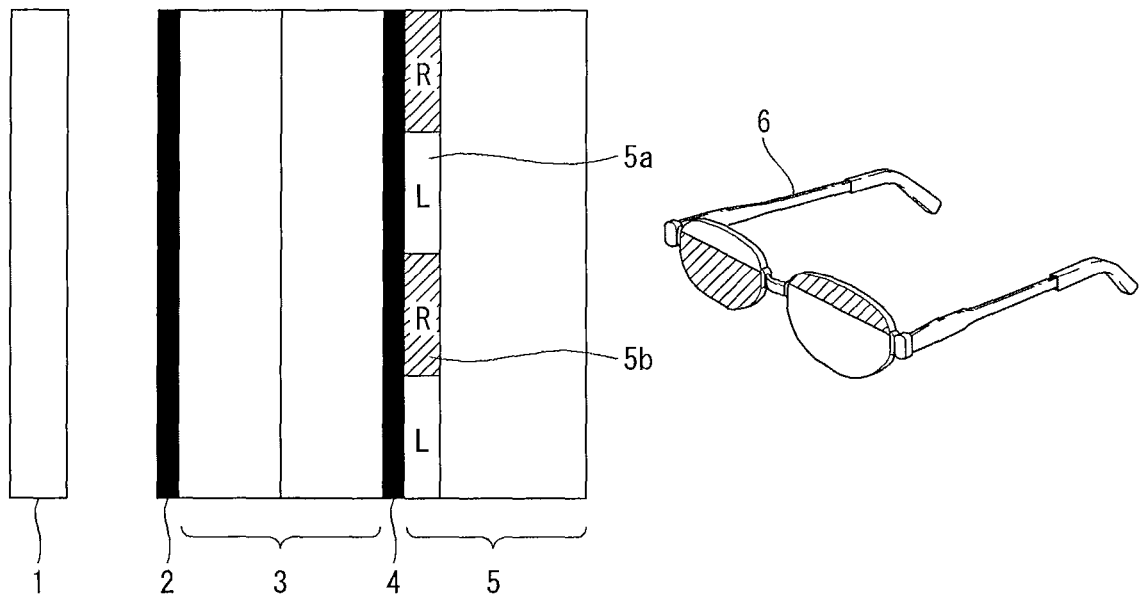
FIG. 1 illustrates a related art patterned retarder type stereoscopic image display.
Figure 2:
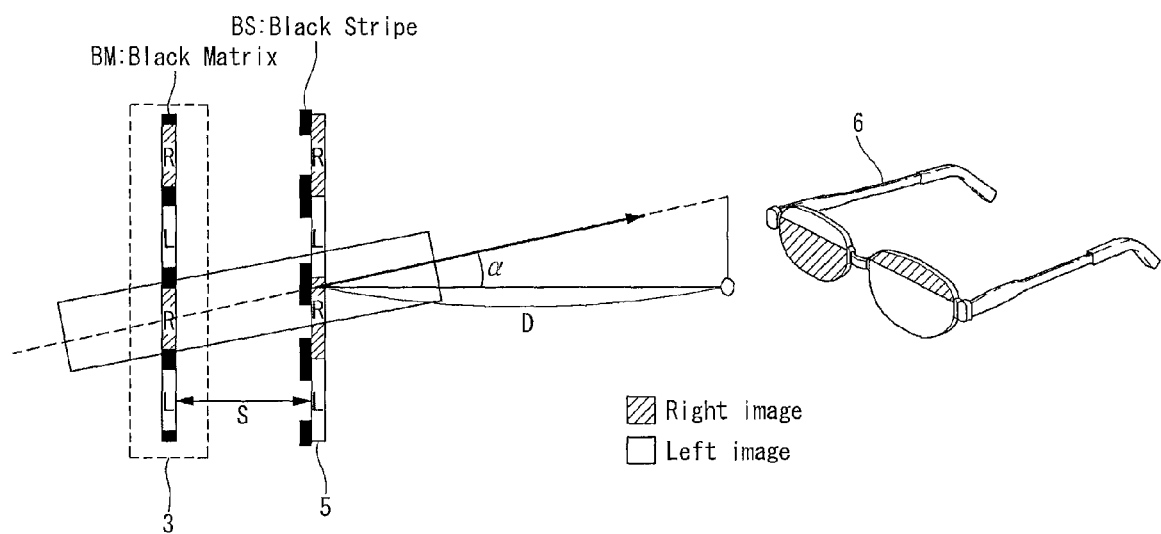
FIG. 2 illustrates a related art stereoscopic image display in which black stripes are formed in a patterned retarder.

The invention will be described more fully hereinafter with reference to the accompanying drawings, in which example embodiments of the inventions are shown. This invention may, however, be embodied in many different forms and should not be construed as limited to the embodiments set forth herein. Like reference numerals designate like elements throughout the specification. In the following description, if it is decided that the detailed description of known function or configuration related to the invention makes the subject matter of the invention unclear, the detailed description is omitted.

Names of elements used in the following description may be selected in consideration of facility of specification preparation. Thus, the names of the elements may be different from names of elements used in a real product.

Figure 3:
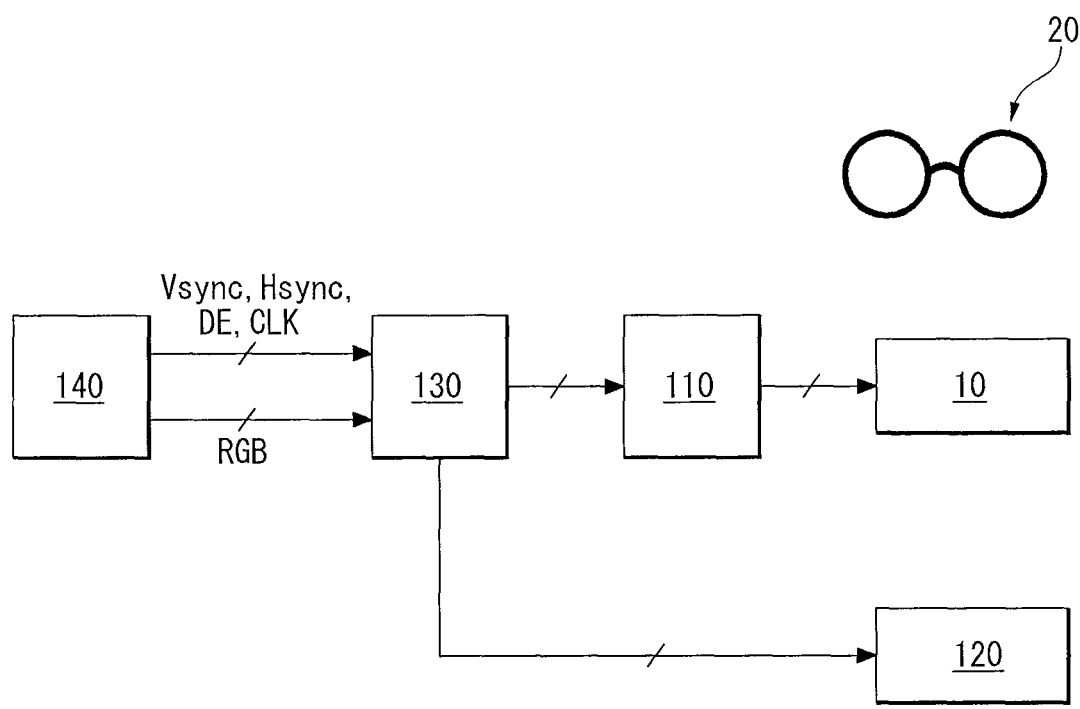
FIG. 3 is a block diagram schematically illustrating a stereoscopic image display according to an exemplary embodiment of the invention.
Figure 4:
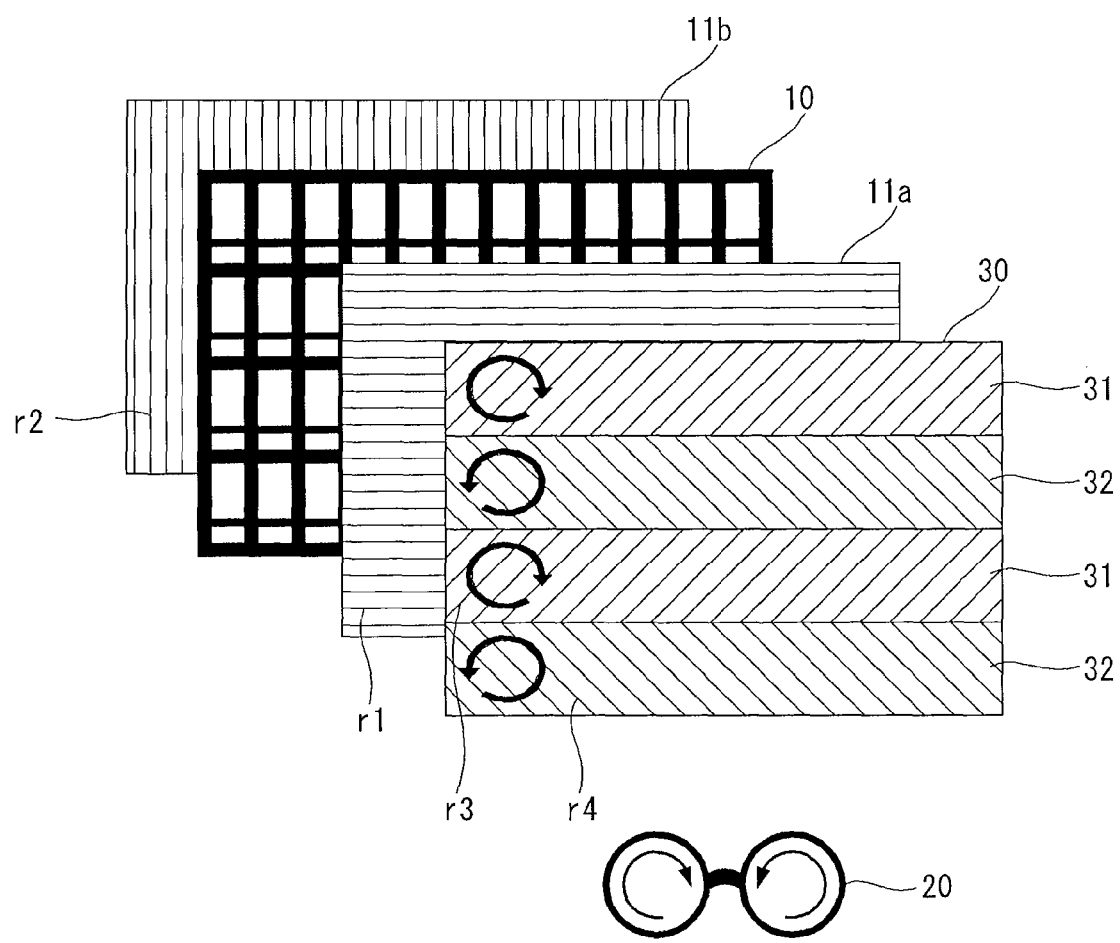
FIG. 4 is an exploded perspective view illustrating a display panel, a patterned retarder, and polarization glasses.
Figure 5:
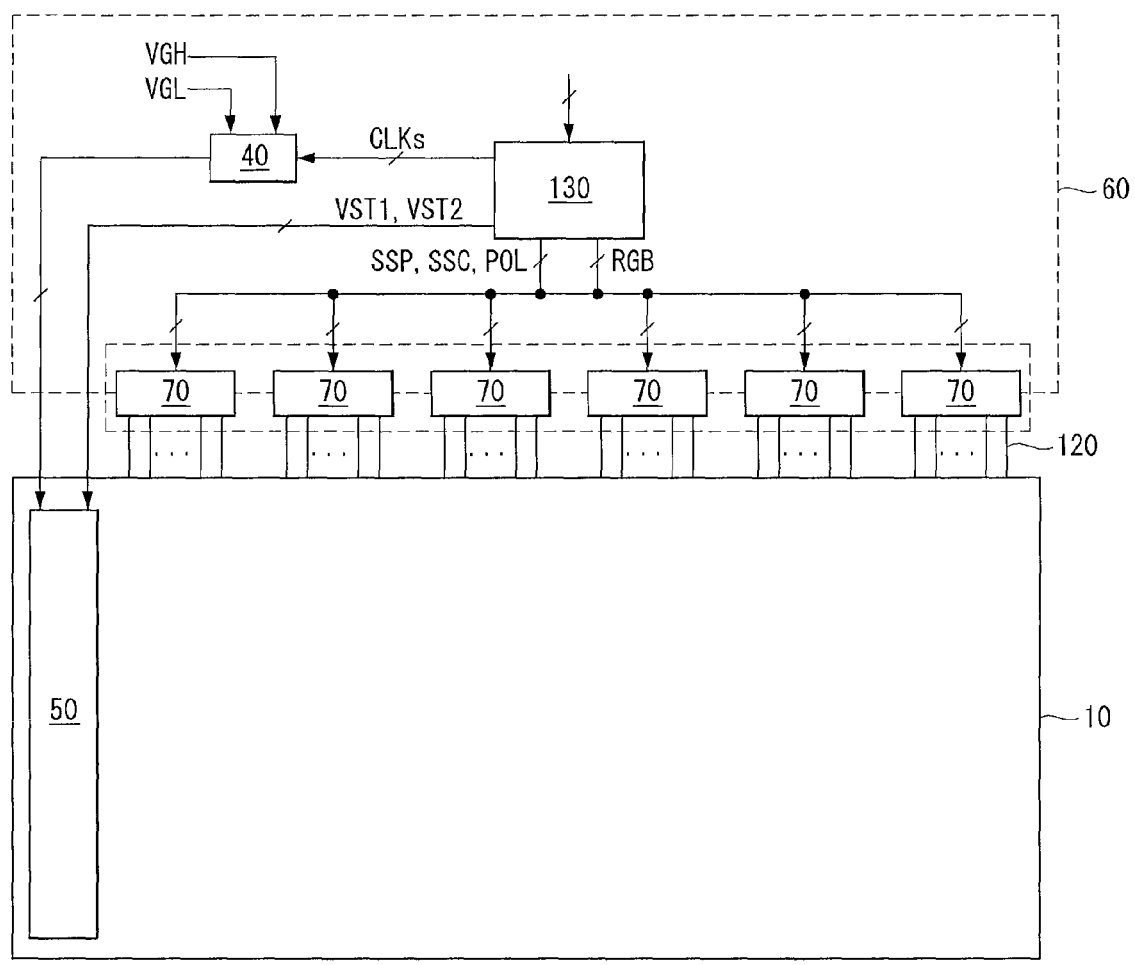
FIG. 5 is a block diagram illustrating in detail a configuration of a display device based on a Gate Driver-IC In Panel (GIP) driving manner.

FIG. 3 is a block diagram schematically illustrating a stereoscopic image display according to an example embodiment of the invention. FIG. 4 is an exploded perspective view illustrating a display panel, a patterned retarder, and polarization glasses. FIG. 5 is a block diagram illustrating in detail a configuration of a display device based on a Gate Driver-IC In Panel (GIP) driving manner. The stereoscopic image display according to the example embodiment of the invention may be implemented as a flat panel display such as a liquid crystal display (LCD), a field emission display (FED), a plasma display panel (PDP), and an organic light emitting diode (OLED) display. In the following description, the example embodiment of the invention describes the liquid crystal display as an example of the stereoscopic image display. Other kinds of flat panel displays may be used.

As shown in FIGS. 3 to 5, the stereoscopic image display according to the example embodiment of the invention includes a display panel 10, polarization glasses 20, a gate driver 110, a data driver 120, a timing controller 130, a host system 140, and the like. The display panel 10 displays an image under the control of the timing controller 130. The display panel 10 includes a thin film transistor (TFT) substrate, a color filter substrate, and a liquid crystal layer between the TFT substrate and the color filter substrate.

Data lines and gate lines (or scan lines) are formed on the TFT substrate to cross each other, and a plurality of liquid crystal cells are arranged in a plurality of cell regions defined by the data lines and the gate lines in a matrix form. A TFT formed at each of crossings of the data lines and the gate lines transfers a data voltage supplied via the data line to a pixel electrode of the liquid crystal cell in response to a gate pulse received through the gate line. For this, a gate electrode of the TFT is connected to the gate line, a source electrode of the TFT is connected to the data line, and a drain electrode of the TFT is connected to the pixel electrode of the liquid crystal cell and a storage capacitor. The storage capacitor holds the data voltage transferred to the pixel electrode for a predetermined time until a next data voltage enters. A common voltage is supplied to a common electrode opposite the pixel electrode.

The color filter substrate includes black matrixes and color filters. The common electrode is formed on the color filter substrate in a vertical electric field driving manner such as a twisted nematic (TN) mode and a vertical alignment (VA) mode. The common electrode is formed on the TFT substrate along with the pixel electrode in a horizontal electric field driving manner such as an in-plane switching (IPS) mode and a fringe field switching (FFS) mode.

As shown in FIG. 4, an upper polarizing plate 11a is attached to the color filter substrate of the display panel 10, and a lower polarizing plate 11b is attached to the TFT substrate of the display panel 10. A light transmission axis r1 of the upper polarizing plate 11a is perpendicular to a light transmission axis r2 of the lower polarizing plate 11b. Alignment layers for setting pre-tilt angles of liquid crystals are respectively formed on the TFT substrate and the color filter substrate of the display panel 10. A spacer is formed between the TFT substrate and the color filter substrate of the display panel 10 so as to provide a cell gap of the liquid crystal layer.

The display panel 10 may be implemented in any liquid crystal mode as well as the TN, VA, IPS, and FFS modes.

Each of pixels of the display panel 10 includes a red subpixel, a green subpixel, and a blue subpixel. Each of the red subpixel, the green subpixel, and the blue subpixel includes a data display part and an active black stripe part. This is described in detail below with reference to FIG. 6.

In a 2D mode, pixels of odd-numbered lines of the display panel 10 and pixels of even-numbered lines of the display panel 10 display a 2D image. In a 3D mode, the pixels of the odd-numbered lines of the display panel 10 display a left eye image (or a right eye image), and the pixels of the even-numbered lines of the display panel 10 display the right eye image (or the left eye image). Light of the image displayed on the pixels of the display panel 10 is incident on a patterned retarder 30 disposed on the display panel 10 through the upper polarizing plate 11a.

As shown in FIG. 4, first retarders 31 are formed on odd-numbered lines of the patterned retarder 30, and second retarders 32 are formed on even-numbered lines of the patterned retarder 30. Thus, the pixels of the odd-numbered lines of the display panel 10 are positioned opposite the first retarders 31 formed on the odd-numbered lines of the patterned retarder 30, and the pixels of the even-numbered lines of the display panel 10 are positioned opposite the second retarders 32 formed on the even-numbered lines of the patterned retarder 30.

The first retarders 31 retard a phase of light from the display panel 10 by +λ/4, where λ is a wavelength of light. The second retarders 32 retard a phase of the light from the display panel 10 by −λ/4. An optical axis r3 of the first retarder 31 is perpendicular to an optical axis r4 of the second retarder 32. The first retarders 31 may be configured so as to pass through only first circularly polarized light (for example, left-circularly polarized light), and the second retarders 32 may be configured so as to pass through only second circularly polarized light (for example, right-circularly polarized light).

A left eye polarization filter of the polarization glasses 20 has the same optical axis as the first retarder 31 of the patterned retarder 30, and a right eye polarization filter of the polarization glasses 20 has the same optical axis as the second retarder 32 of the patterned retarder 30. For example, a left circular polarization filter may be selected as the left eye polarization filter of the polarization glasses 20, and a right circular polarization filter may be selected as the right eye polarization filter of the polarization glasses 20. A user has to wear the polarization glasses 20 when viewing a 3D image, and has to remove the polarization glasses 20 when viewing a 2D image.

In other words, in the stereoscopic image display according to the example embodiment of the invention, the left eye image displayed on the pixels of the odd-numbered lines of the display panel 10 passes through the first retarder 31 and is converted into the left-circularly polarized light, and the right eye image displayed on the pixels of the even-numbered lines of the display panel 10 passes through the second retarder 32 and is converted into the right-circularly polarized light. The left-circularly polarized light passes through the left eye polarization filter of the polarization glasses 20 and reaches the user's left eye, and the right-circularly polarized light passes through the right eye polarization filter of the polarization glasses 20 and reaches the user's right eye. Thus, the user views only the left eye image through his or her left eye and views only the right eye image through his/her right eye.

As shown in FIG. 5, the data driver 120 includes a plurality of source driver integrated circuits (ICs) 70. The source driver ICs 70 convert image data RGB received from the timing controller 130 into positive and negative gamma compensation voltages and generate positive and negative analog data voltages. The source driver ICs 70 then supply the positive and negative analog data voltages to the data lines of the display panel 10.

The gate driver 110 sequentially supplies the gate pulse synchronized with the data voltage to the gate lines of the display panel 10 under the control of the timing controller 130. The gate driver 110 includes a level shifter 40, a shift register 50, and the like. The level shifter 40 level-shifts a transistor-transistor-logic (TTL) level voltage of clocks CLK received from the timing controller 110 to a gate high voltage VGH and a gate low voltage VGL. In the GIP manner, the level shifter 40 is mounted on a printed circuit board (PCB) 60, and the shift register 50 is directly formed on the TFT substrate of the display panel 10. The shift register 50 is described in detail below with reference to FIGS. 7 and 8.

A backlit liquid crystal display panel modulating light from a backlight unit may be generally selected as the display panel 10. The backlight unit includes a plurality of light sources, that are turned on based on a driving current supplied by a backlight unit driver, a light guide plate (or a diffusion plate), a plurality of optical sheets, and the like. The backlight unit may be implemented as one of an edge type backlight unit and a direct type backlight unit. The light sources of the backlight unit may include one or at least two of a hot cathode fluorescent lamp (HCFL), a cold cathode fluorescent lamp (CCFL), an external electrode fluorescent lamp (EEFL), and a light emitting diode (LED).

The backlight unit driver generates the driving current for turning on the light sources of the backlight unit. The backlight unit driver switches on or off the driving current supplied to the light sources under the control of the timing controller 130. The timing controller 130 outputs backlight control data, that adjusts a backlight luminance and a turn-on timing of the light sources in response to a global or local dimming signal received from the host system 140, to the backlight unit driver in a serial peripheral interface (SPI) data format.

The timing controller 130 receives the image data RGB and timing signals such as a vertical sync signal Vsync, a horizontal sync signal Hsync, a data enable DE, and clocks CLK from the host system 140. The timing controller 130 outputs a gate control signal for controlling the gate driver 110 to the gate driver 110 and outputs a data control signal for controlling the data driver 120 to the data driver 120 based on the timing signals. The gate control signal includes first and second start voltages VST1 and VST2, clocks CLK, and the like. The first start voltage VST1 controls an output timing of a first gate pulse of an A-stage of the shift register 50. The second start voltage VST2 controls an output timing of a first gate pulse of a B-stage of the shift register 50. The clocks CLK may be i-phase clocks, where 'i' is a natural number equal to or greater than 3. The clocks CLK are input to the shift register 50 and control an output of the shift register 50.

The data control signal includes a source start pulse SSP, a source sampling clock SSC, a polarity control signal POL, a source output enable SOE, and the like. The source start pulse SSP controls a data sampling start time point of the data driver 120. The source sampling clock SSC controls a sampling operation of the data driver 120 based on a rising or falling edge thereof. If digital video data to be input to the data driver 120 is transferred based on a mini low voltage differential signaling (LVDS) interface standard, the source start pulse SSP and the source sampling clock SSC may be omitted. The polarity control signal POL inverts a polarity of the data voltage output by the data driver 120 every L horizontal periods, where L is a natural number. The source output enable SOE controls an output timing of the data driver 120.

The host system 140 supplies the image data RGB to the timing controller 130 through an interface such as an LVDS interface and a transition minimized differential signaling (TMDS) interface. Further, the host system 140 supplies the timing signals Vsync, Hsync, DE, and CLK and a mode signal MODE to the timing controller 130. The mode signal MODE distinguishes the 2D mode from the 3D mode.

Figure 6:
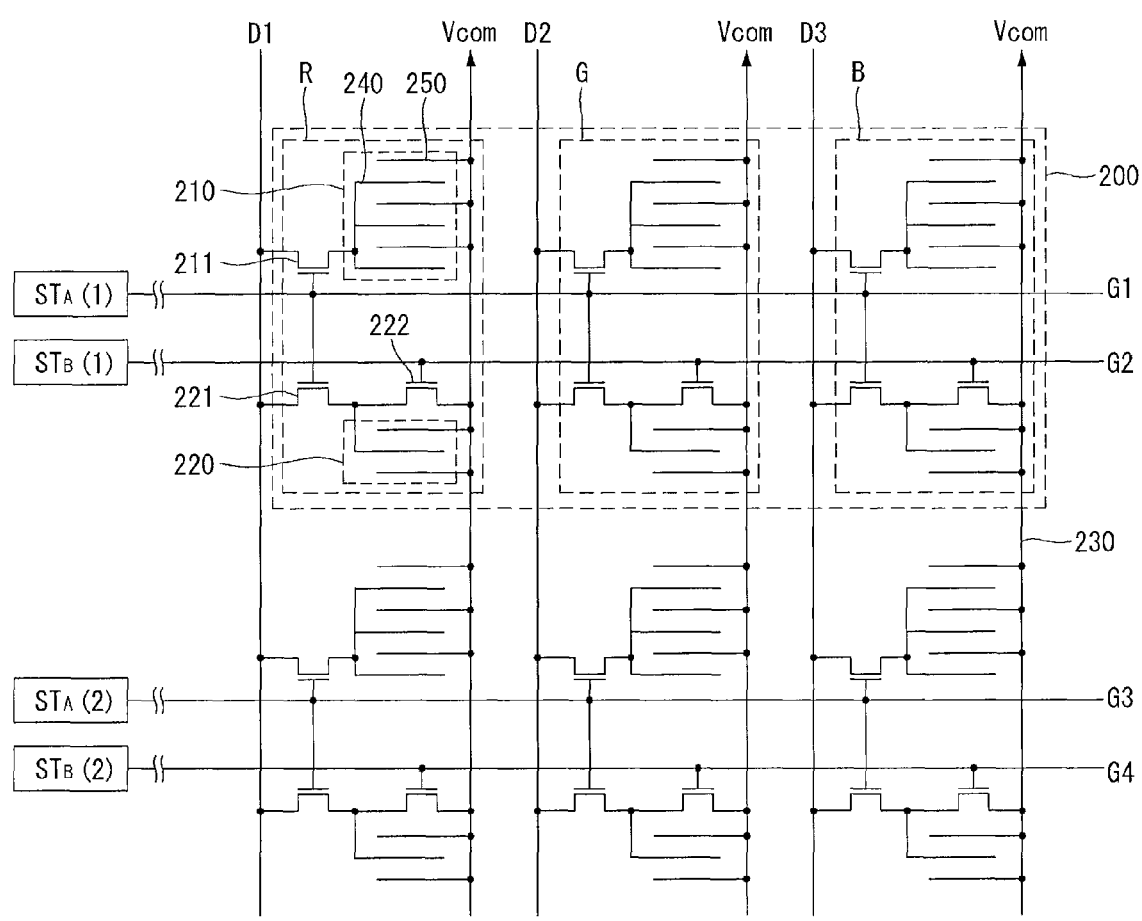
FIG. 6 is a circuit diagram illustrating in detail some of pixels of a display panel controlled by active black stripes according to an exemplary embodiment of the invention.

FIG. 6 is a circuit diagram illustrating in detail some of pixels of the display panel controlled by active black stripes according to the example embodiment of the invention. As shown in FIG. 6, the display panel 10 includes j×k pixels 200, where j and k are a positive integer equal to or greater than 2. Each of the j×k pixels 200 includes a red subpixel R, a green subpixel G, and a blue subpixel B.

Each of the red, green, and blue subpixels R, G, and B includes a data display part 210 and an active black stripe part 220. A liquid crystal cell of the data display part 210 is connected to a first scan TFT 211 and is driven by an electric field between a pixel electrode 240 and a common electrode 250 of the data display part 210. The first scan TFT 211 supplies a data voltage of a data line D1, D2, or D3 to the pixel electrode 240 of the data display part 210 in response to a gate pulse of a (2n−1)th gate line G1 or G3, where n is a natural number. A gate electrode of the first scan TFT 211 is connected to the (2n−1)th gate line G1 or G3, a drain electrode of the first scan TFT 211 is connected to the data line D1, D2, or D3, and a source electrode of the first scan TFT 211 is connected to the pixel electrode 240 of the data display part 210.

A liquid crystal cell of the active black stripe part 220 is connected to a second scan TFT 221 and a third scan TFT 222 and is driven by an electric field between a pixel electrode 240 and a common electrode 250 of the active black stripe part 220. The second scan TFT 221 supplies the data voltage of the data line D1, D2, or D3 to the pixel electrode 240 of the active black stripe part 220 in response to the gate pulse of the (2n−1)th gate line G1 or G3. A gate electrode of the second scan TFT 221 is connected to the (2n−1)th gate line G1 or G3, a drain electrode of the second scan TFT 221 is connected to the data line D1, D2, or D3, and a source electrode of the second scan TFT 221 is connected to the pixel electrode 240 of the active black stripe part 220.

In the 2D mode, because the gate pulse is not supplied to a (2n)th gate line G2 or G4, the third scan TFT 222 remains in a turned-off state. In the 3D mode, the third scan TFT 222 supplies a common voltage Vcom from a common voltage line 250 to the pixel electrode 240 of the active black stripe part 220 in response to the gate pulse of the (2n)th gate line G2 or G4. A gate electrode of the third scan TFT 222 is connected to the (2n)th gate line G2 or G4, a drain electrode of the third scan TFT 222 is connected to the common voltage line 250, and a source electrode of the third scan TFT 222 is connected to the pixel electrode 240 of the active black stripe part 220.

The shift register 50 includes A-stages $ST_A(1)$ and $ST_A(2)$ and B-stages $ST_B(1)$ and $ST_B(2)$. The A-stages $ST_A(1)$ and $ST_A(2)$ sequentially output the gate pulse to the (2n−1)th gate lines G1 and G3, and the B-stages $ST_B(1)$ and $ST_B(2)$ sequentially output the gate pulse to the (2n)th gate lines G2 and G4.

In the 2D mode, the A-stages $ST_A(1)$ and $ST_A(2)$ sequentially output the gate pulse to the (2n−1)th gate lines G1 and G3, but the B-stages $ST_B(1)$ and $ST_B(2)$ do not output the gate pulse to the (2n)th gate lines G2 and G4. Alternatively, in the 2D mode, the A-stages $ST_A(1)$ and $ST_A(2)$ sequentially output the gate pulse to the (2n−1)th gate lines G1 and G3, and the B-stages $ST_B(1)$ and $ST_B(2)$ may sequentially output the gate pulse to the (2n)th gate lines G2 and G4. In this instance, the output of the B-stages $ST_B(1)$ and $ST_B(2)$ is earlier than the output of the A-stages $ST_A(1)$ and $ST_A(2)$ by a predetermined time.

In the 3D mode, the A-stages $ST_A(1)$ and $ST_A(2)$ sequentially output the gate pulse to the (2n−1)th gate lines G1 and G3, and the B-stages $ST_B(1)$ and $ST_B(2)$ sequentially output the gate pulse to the (2n)th gate lines G2 and G4. In this instance, the output of the A-stages $ST_A(1)$ and $ST_A(2)$ is earlier than the output of the B-stages $ST_B(1)$ and $ST_B(2)$ by a predetermined time. The input and output operations of the shift register 50 are described in detail below with reference to FIGS. 9 to 11.

In the 2D mode, the data driver 120 outputs the data voltage of the 2D image to the data lines D1 to D3 in synchronization with the gate pulse of the (2n−1)th gate lines G1 and G3. Thus, the data voltage of the 2D image is supplied to the data display part 210 and the active black stripe part 220. In the 3D mode, the data driver 120 outputs the data voltage of the 3D image to the data lines D1 to D3 in synchronization with the gate pulse of the gate lines G1 to G4. Thus, the data voltage of the 3D image is supplied to the data display part 210 and the active black stripe part 220. Further, the common voltage Vcom is supplied to the active black stripe part 220 by the gate pulse of the (2n)th gate lines G2 and G4.

As a result, in the 2D mode, the data display part 210 and the active black stripe part 220 are charged to the red, green, and blue data voltages of the 2D image. In the 3D mode, the data display part 210 is charged to the red, green, and blue data voltages of the 3D image, and the active black stripe part 220 is charged to the common voltage Vcom.

Figure 7A:
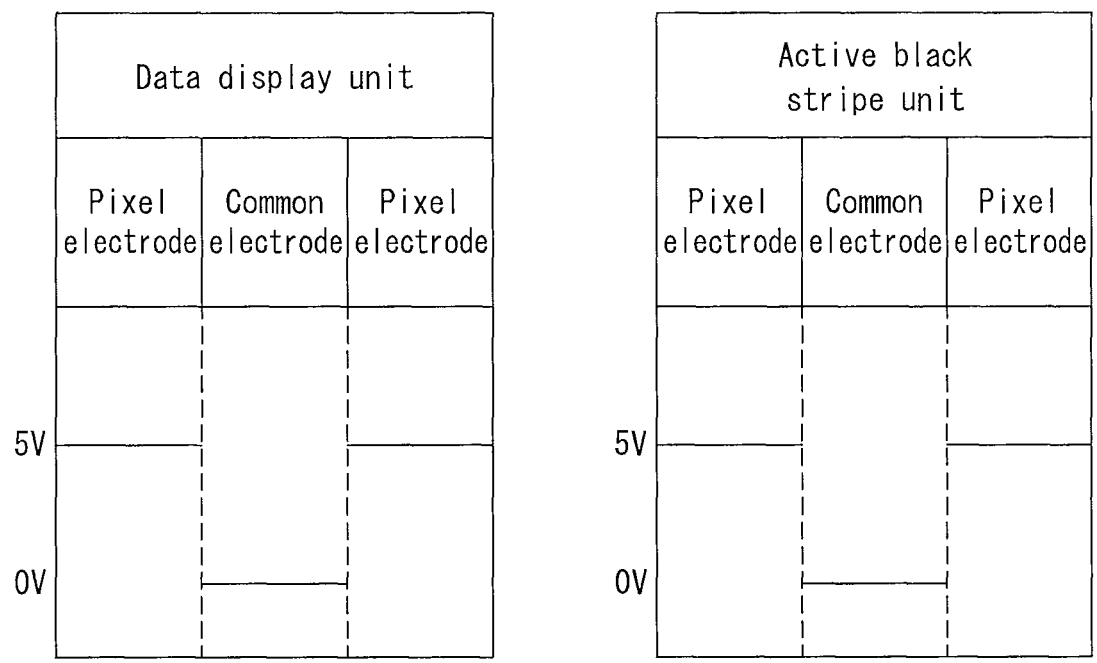
FIGS. 7A and 7B illustrate voltages of a pixel electrode and a common electrode of each of pixels of a display panel in a 2D mode and a 3D mode.
Figure 7B:
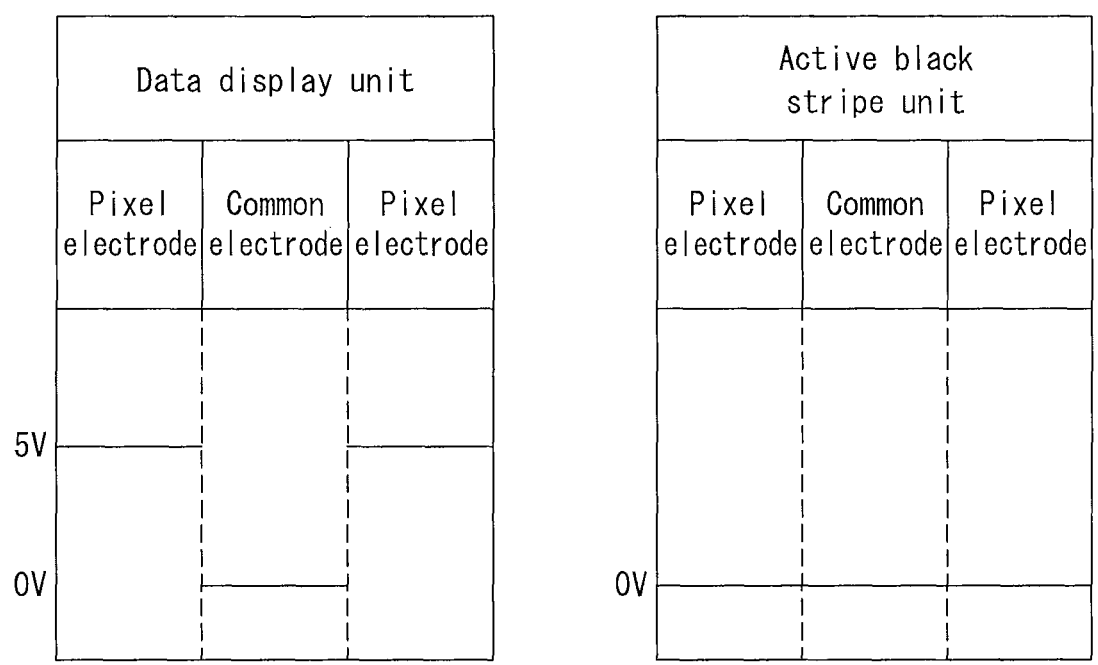

FIGS. 7A and 7B illustrate voltages of the pixel electrode and the common electrode of each of the data display part and the active black stripe part in the 2D mode and the 3D mode. As shown in FIG. 7A, in the 2D mode, the pixel electrode of each of the data display part 210 and the active black stripe part 220 is charged to the data voltage. As shown in FIG. 7B, in the 3D mode, the pixel electrode of the data display part 210 is charged to the data voltage, but the pixel electrode of the active black stripe part 220 is charged to the common voltage Vcom. In other words, in the 2D mode, the active black stripe part 220 is charged to the data voltage of the 2D image, thereby increasing a luminance and a chrominance of the 2D image. Hence, the display quality of the 2D image is improved. In the 3D mode, the active black stripe part 220 is charged to the common voltage Vcom and displays a black image, thereby serving as a black stripe.

The configuration and the operation of the shift register 50 are described below. More specifically, a method for charging the pixel electrode of each of the data display part 210 and the active black stripe part 220 to the data voltage in the 2D mode, and for charging the pixel electrode of the data display part 210 the data voltage and the pixel electrode of the active black stripe part 220 to the common voltage Vcom in the 3D mode.

Figure 8:
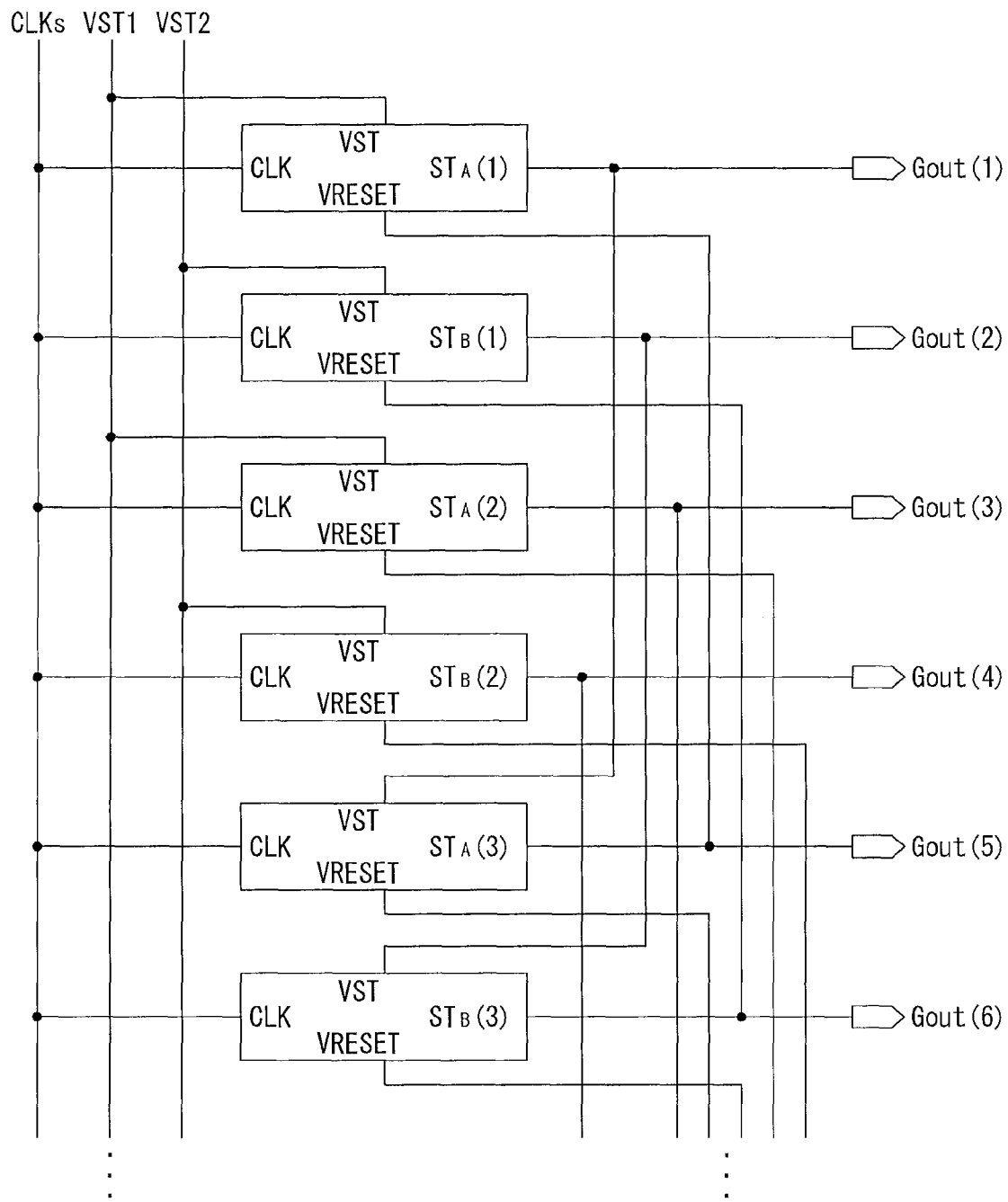
FIG. 8 is a block diagram illustrating in detail a configuration of a shift register according to an exemplary embodiment of the invention.

FIG. 8 is a block diagram illustrating in detail the configuration of the shift register according to the example embodiment of the invention. As shown in FIG. 8, the shift register 50 includes a plurality of cascade-connected A-stages $ST_A(1)$ to $ST_A(n)$ and a plurality of cascade-connected B-stages $ST_B(1)$ to $ST_B(n)$.

Each of the A-stages $ST_A(1)$ to $ST_A(n)$ and each of the B-stages $ST_B(1)$ to $ST_B(n)$ have one output channel and output one gate pulse. The gate pulse is applied to the gate lines of the display panel 10, and at the same time, serves as a carry signal transferred to a front stage and a rear stage.

In the following description, the front stage is referred to as a stage positioned in front of a base stage, and the rear stage is referred to as a stage positioned in rear of the base stage. For example, when a kth A-stage $ST_A(k)$ is the base stage, where k is a natural number (i.e., equal to or greater than 2) within the range of 1<k<n, the front stage indicates one of the first A-stage $ST_A(1)$ to the (k−1)th A-stage $ST_A(k−1)$ and the rear stage indicates one of the (k+1)th A-stage $ST_A(k+1)$ to the nth A-stage $ST_A(n)$. Further, when a kth B-stage $ST_B(k)$ is the base stage, the front stage indicates one of the first B-stage $ST_B(1)$ to the (k−1)th B-stage $ST_B(k−1)$ and the rear stage indicates one of the (k+1) B-stage $ST_B(k+1)$ to the nth B-stage $ST_B(n)$.

The output of each of the plurality of cascade-connected A-stages $ST_A(1)$ to $ST_A(n)$ serves as a carry signal of the rear stage. Therefore, when the first start voltage VST1 is supplied to the A-stages $ST_A(1)$ to $ST_A(n)$, the A-stages $ST_A(1)$ to $ST_A(n)$ sequentially supply the gate pulses to the (2n−1)th gate lines. When the first start voltage VST1 is not supplied, the A-stages $ST_A(1)$ to $ST_A(n)$ do not supply the gate pulse to the (2n−1)th gate lines. Further, the output of each of the plurality of cascade-connected B-stages $ST_B(1)$ to $ST_B(n)$ serves as a carry signal of the rear stage. Therefore, when the second start voltage VST2 is supplied to the B-stages $ST_B(1)$ to $ST_B(n)$, the B-stages $ST_B(1)$ to $ST_B(n)$ sequentially supply the gate pulses to the (2n)th gate lines. When the second start voltage VST2 is not supplied, the B-stages $ST_B(1)$ to $ST_B(n)$ do not supply the gate pulse to the (2n)th gate lines.

The A-stages $ST_A(1)$ to $ST_A(n)$ output gate pulses Gout(1) to Gout(2n−1) in order from the first A-stage $ST_A(1)$ to the nth A-stage $ST_A(n)$. Namely, an output terminal of the kth A-stage $ST_A(k)$ is connected to a (2k−1)th gate line and outputs a (2k−1)th gate pulse. Each of the A-stages $ST_A(1)$ to $ST_A(n)$ operates in response to a carry signal of one front stage applied as a start signal to a first input terminal VST and a carry signal of one rear stage applied as a reset signal to a second input terminal VRESET.

The B-stages $ST_B(1)$ to $ST_B(n)$ output gate pulses Gout(2) to Gout(2*n*) in order from the first B-stage $ST_B(1)$ to the nth B-stage $ST_B(n)$. Namely, an output terminal of the kth B-stage $ST_B(k)$ is connected to a (2k)th gate line and outputs a (2k)th gate pulse. Each of the B-stages $ST_B(1)$ to $ST_B(n)$ operates in response to a carry signal of one front stage applied as a start signal to a first input terminal VST and a carry signal of one rear stage applied as a reset signal to a second input terminal VRESET.

Figure 10:
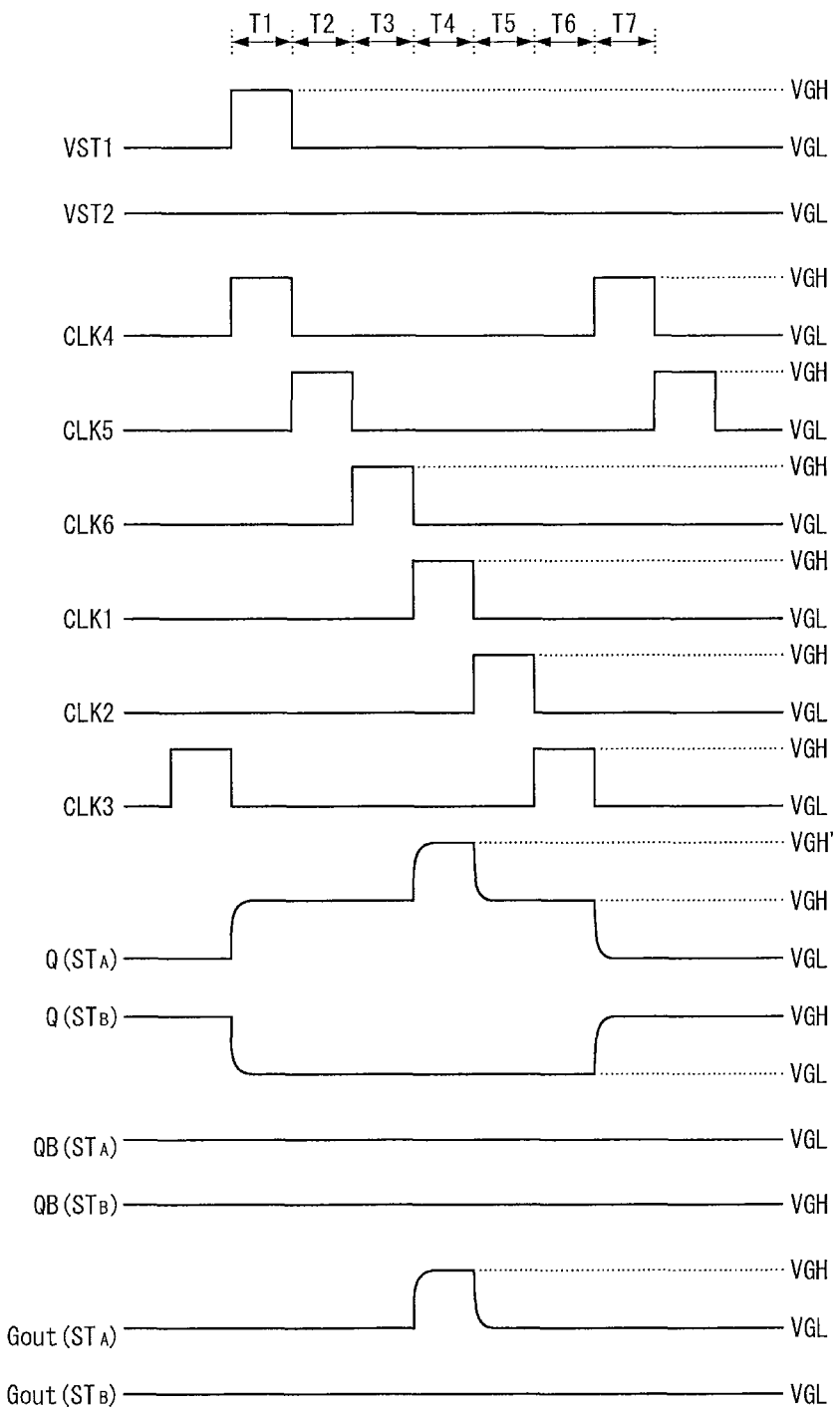
FIG. 10 is a waveform diagram illustrating an example of input and output signals of an A-stage and a B-stage in a 2D mode according to an exemplary embodiment of the invention.
Figure 11:
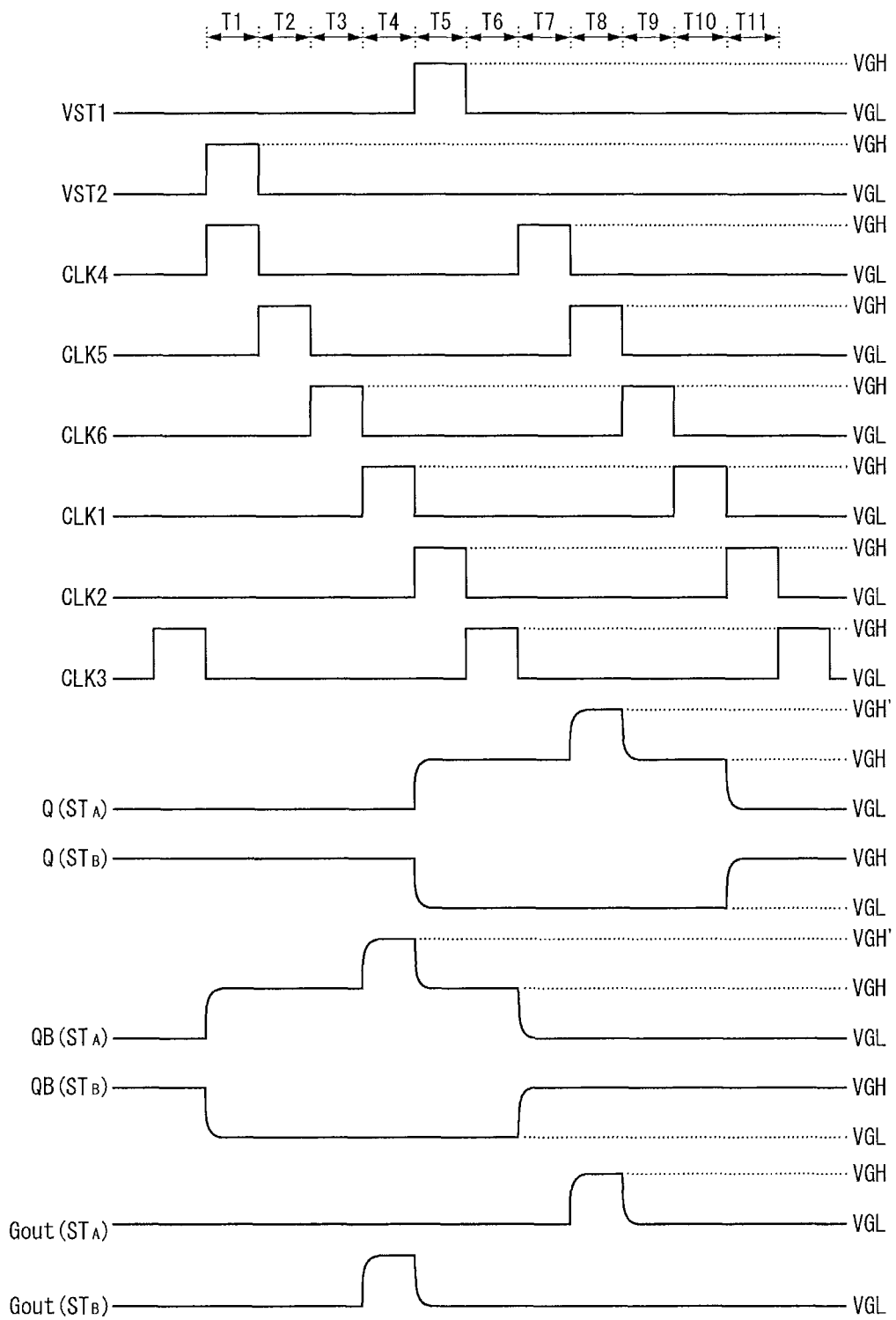
FIG. 11 is a waveform diagram illustrating another example of input and output signals of an A-stage and a B-stage in a 2D mode according to an exemplary embodiment of the invention.
Figure 12:
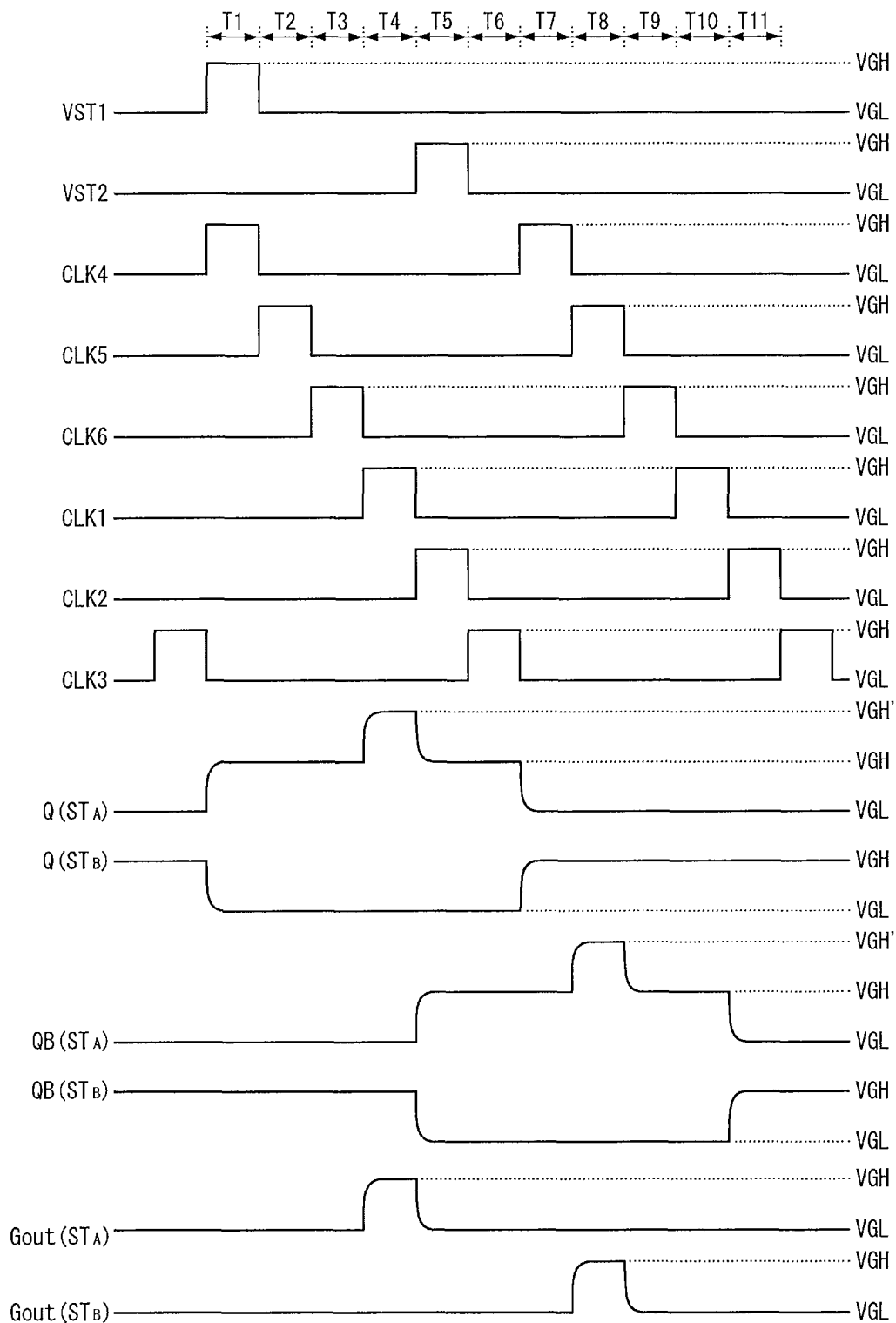
FIG. 12 is a waveform diagram illustrating input and output signals of an A-stage and a B-stage in a 3D mode according to an exemplary embodiment of the invention.

One of i-phase clocks, which have a predetermined pulse width and are sequentially retarded, is input to each of the A-stages $ST_A(1)$ to $ST_A(n)$ and each of the B-stages $ST_B(1)$ to $ST_B(n)$. In the example embodiment of the invention, FIGS. 10 to 12 illustrate 6-phase clocks CLK1 to CLK6, but are not limited thereto. Each of the 6-phase clocks CLK1 to CLK6 has a pulse width of one horizontal period and swings between the gate high voltage VGH and the gate low voltage VGL.

A power voltage VDD and a ground level voltage GND, or a low potential voltage VSS of the gate low voltage VGL are supplied to each of the A-stages $ST_A(1)$ to $ST_A(n)$ and each of the B-stages $ST_B(1)$ to $ST_B(n)$. The gate high voltage VGH is set to a voltage equal to or greater than a threshold voltage of TFTs formed in an active array of the display panel 10. The gate low voltage VGL is set to a voltage less than a threshold voltage of TFTs formed in a TFT array of the display panel 10. The gate high voltage VGH may be set to about 20V to 30V, and the gate low voltage VGL may be set to about −5V.

Figure 9:
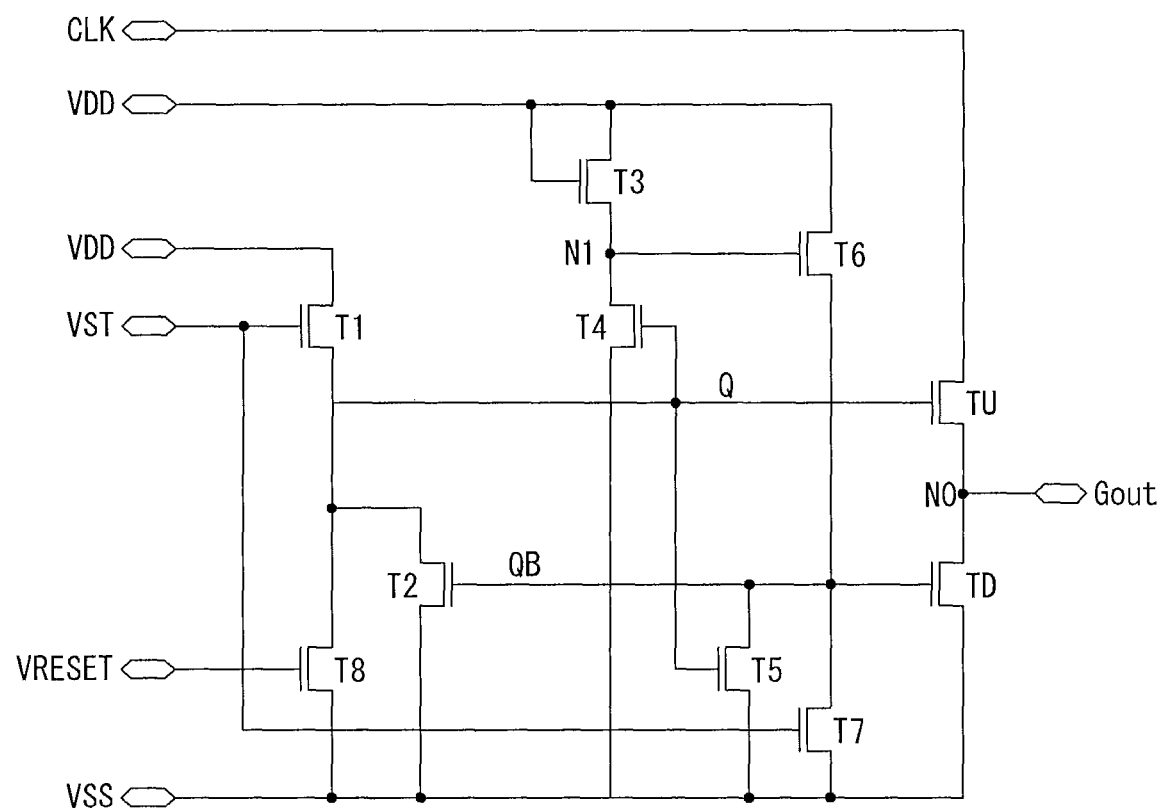
FIG. 9 illustrates an example of a circuit configuration of an A-stage shown in FIG. 8.

FIG. 9 illustrates an example of a circuit configuration of the A-stage shown in FIG. 8. Since a circuit configuration of the B-stage is substantially the same as the circuit configuration of the A-stage, a further description may be briefly made or may be entirely omitted. As shown in FIG. 9, one of the 6-phase clocks is input to a clock terminal CLK of each of the A-stages $ST_A(1)$ to $ST_A(n)$.

Each of the A-stages $ST_A(1)$ to $ST_A(n)$ includes a Q node charging unit, that charges a Q node in response to a signal input through the first input terminal VST, a node controller for controlling charging and discharging operations of the Q node and a QB node, a Q node discharging unit, that discharges the Q node in response to a signal input through the second input terminal VRESET, and an output unit for outputting the gate pulse based on voltages of the Q node and the QB node.

The Q node charging unit includes a first TFT T1 for charging the Q node. The first TFT T1 applies the power voltage VDD to the Q node in response to the start signal input through the first input terminal VST. An output Gout(2k−7) of a (k−3)th A-stage $ST_A(k−3)$ as the start signal is input to the first TFT T1 of the kth A-stage $ST_A(k)$. The first start voltage VST as the start signal is input to the first TFTs T1 of the first and second A-stages $ST_A(1)$ and $ST_A(2)$. A gate electrode of the first TFT T1 is connected to the first input terminal VST, a drain electrode of the first TFT T1 is connected to an input terminal of the power voltage VDD, and a source electrode of the first TFT T1 is connected to the Q node.

The node controller includes a second TFT T2 for controlling the Q node and third to seventh TFTs T3 to T7 for controlling the QB node. The second TFT T2 discharges the Q node to the low potential voltage VSS based on the voltage of the QB node. A gate electrode of the second TFT T2 is connected to the QB node, a drain electrode of the second TFT T2 is connected to the Q node, and a source electrode of the second TFT T2 is connected to an input terminal of the low potential voltage VSS. The third TFT T3 is diode-connected and applies the power voltage VDD to a first node N1. A gate electrode and a drain electrode of the third TFT T3 are connected to the input terminal of the power voltage VDD, and a source electrode of the third TFT T3 is connected to the first node Ni. The fourth TFT T4 switches on or off a current path between the first node N1 and the input terminal of the low potential voltage VSS based on the voltage of the Q node. A gate electrode of the fourth TFT T4 is connected to the Q node, a drain electrode of the fourth TFT T4 is connected to the first node N1, and a source electrode of the fourth TFT T4 is connected to the input terminal of the low potential voltage VSS. The fifth TFT T5 discharges the QB node to the low potential voltage VSS based on the voltage of the Q node. A gate electrode of the fifth TFT T5 is connected to the Q node, a drain electrode of the fifth TFT T5 is connected to the QB node, and a source electrode of the fifth TFT T5 is connected to the input terminal of the low potential voltage VSS. The sixth TFT T6 charges the QB node to the power voltage VDD based on the voltage of the first node N1. A gate electrode of the sixth TFT T6 is connected to the first node N1, a drain electrode of the sixth TFT T6 is connected to an input terminal VDD_O of the power voltage VDD, and a source electrode of the sixth TFT T6 is connected to the QB node. The seventh TFT T7 discharges the QB node to the low potential voltage VSS in response to the start signal input through the first input terminal VST. A gate electrode of the seventh TFT T7 is connected to the first input terminal VST, a drain electrode of the seventh TFT T7 is connected to the QB node, and a source electrode of the seventh TFT T7 is connected to the input terminal of the low potential voltage VSS.

The Q node discharging unit includes an eighth TFT T8 for discharging the Q node. The eighth TFT T8 discharges the Q node to the low potential voltage VSS in response to the start signal input through the second input terminal VRESET. An output Gout(2k+5) of a (k+3)th A-stage $ST_A(k+3)$ as the reset signal is input to the eighth TFT T8 of the kth A-stage $ST_A(k)$. The first start voltage VST as the reset signal is input to the eighth TFTs T8 of the (n–1)th and nth A-stages $ST_A(n-1)$ and $ST_A(n)$. A gate electrode of the eighth TFT T8 is connected to the second input terminal VRESET, a drain electrode of the eighth TFT T8 is connected to the Q node, and a source electrode of the eighth TFT T8 is connected to the input terminal of the power voltage VDD.

The output unit includes a pull-up TFT TU and a pull-down TFT TD that generate an output of the gate pulse. The pull-up TFT TU is turned on based on the voltage of the Q node and charges an output node NO to a clock input through the clock terminal CLK. The pull-down TFT TD is turned on based on the voltage of the QB node and discharges the output node NO to the low potential voltage VSS.

The pull-up TFT TU is turned on due to bootstrapping of the Q node and thus charges the output node NO to the clock input through the clock terminal CLK to thereby generate the gate pulse. A gate electrode of the pull-up TFT TU is connected to the Q node, a drain electrode of the pull-up TFT TU is connected to the clock terminal CLK, and a source electrode of the pull-up TFT TU is connected to the output node NO. The pull-down TFT TD discharges the output node NO to the low potential voltage VSS based on the voltage of the QB node, so as to hold the output of the gate pulse in a falling state. A gate electrode of the pull-down TFT TD is connected to the QB node, a drain electrode of the pull-down TFT TD is connected to the output node NO, and a source electrode of the pull-down TFT TD is connected to the input terminal of the low potential voltage VSS. A (2k–1)th gate pulse Gout(2k–1) output from the kth A-stage $ST_A(k)$ is input to the second input terminal VRESET of a (k–3)th A-stage $ST_A(k-3)$ and the first input terminal VST of the (k+3)th A-stage $ST_A(k+3)$.

FIG. 10 is a waveform diagram illustrating an example of input and output signals of the A-stage and the B-stage in the 2D mode according to the example embodiment of the invention. As shown in FIGS. 9 and 10, the first and second start voltages VST1 and VST2 are generated, and the 6-phase clocks CLK1 to CLK6 are generated as cycle clocks, that are sequentially retarded in order from the first clock CLK1 to the sixth clock CLK6.

First, an operation of the kth A-stage $ST_A(k)$ is described below. It is assumed that the clock input to the clock terminal CLK of the kth A-stage $ST_A(k)$ is the first clock CLK1.

During a period T1, the first start voltage VST1 or a (2k–7)th output Gout(2k–7) as the start signal is input to the kth A-stage $ST_A(k)$ through the first input terminal VST. The first TFT T1 is turned on in response to the first start voltage VST1 or the (2k–7)th output Gout(2k–7). As a result, the Q node is charged to the gate high voltage VGH, and the QB node is discharged to the gate low voltage VGL.

During periods T2 and T3, the Q node is held at the gate high voltage VGH, and the QB node is held at the gate low voltage VGL.

During a period T4, the first gate shift clock CLK1 is applied to the drain electrode of the pull-up TFT TU. Because the Q node is bootstrapped due to a parasitic capacitance between the gate electrode and the drain electrode of the pull-up TFT TU, the voltage of the Q node increases to a voltage level VGH' greater than the gate high voltage VGH and turns on the pull-up TFT TU. Thus, the voltage of the output node NO increases to the gate high voltage VGH and rises the (2k–1)th gate pulse Gout(2k–1), and the QB node is held at the gate low voltage VGL.

During a period T5, because the first gate shift clock CLK1 is not applied to the drain electrode of the pull-up TFT TU, the voltage of the Q node is held at the gate high voltage VGH and the pull-up TFT TU is turned off. Thus, the (2k–1)th gate pulse Gout(2k–1) falls to the gate low voltage VGL, and the QB node is held at the gate low voltage VGL.

During a period T6, the Q node is held at the gate high voltage VGH, and the QB node is held at the gate low voltage VGL.

During a period T7, the first start voltage VST1 or a (2k+5)th output Gout(2k+5) as the reset signal is input to the kth A-stage $ST_A(k)$ through the second input terminal VRESET. The eighth TFT T8 is turned on in response to the first start voltage VST1 or the (2k+5)th output Gout(2k+5). As a result, the Q node is discharged to the gate low voltage VGL. Because the fourth TFT T4 and the fifth TFT T5 are turned off due to the discharging operation of the Q node, the QB node is charged to the power voltage VDD of the gate high voltage VGH applied through the sixth TFT T6. The pull-down TFT TD is turned on due to the charging operation of the QB node. Hence, the voltage of the output node NO falls to the gate low voltage VGL, and the (2k–1)th gate pulse Gout(2k–1) is held at the gate low voltage VGL.

Next, an operation of the kth B-stage $ST_B(k)$ is described. As shown in FIGS. 9 and 10, in the 2D mode, the second start voltage VST2 is not applied to the B-stages $ST_B(1)$ to $ST_B(n)$. Because the start signal is not input to the first input terminal VST of the kth B-stage $ST_B(k)$, the Q node of the kth B-stage $ST_B(k)$ is held at the gate low voltage VGL and the QB node is held at the gate high voltage VGH. Further, the kth B-stage $ST_B(k)$ holds a (2k)th gate pulse Gout(2k) to the gate low voltage VGL.

As shown in FIG. 10, in the 2D mode, each of the A-stages $ST_A(1)$ to $ST_A(n)$ outputs the gate pulse to the (2n–1)th gate lines, and the B-stages $ST_B(1)$ to $ST_B(n)$ do not output the gate pulse to the (2n)th gate lines. In the 2D mode, the pixel electrode of the data display part 210 is charged to the data voltage due to the turn-on operation of the first scan TFT 211 of the data display part 210 as shown in FIG. 7A. Further, because the second scan TFT 221 of the active black stripe part 220 is turned on and the third scan TFT 222 of the active black stripe part 220 is not turned on, the pixel electrode of the active black stripe part 220 is charged to the data voltage as shown in FIG. 7A. Thus, in the 2D mode, the data display part 210 and the active black stripe part 220 display the 2D image.

FIG. 11 is a waveform diagram illustrating another example of input and output signals of the A-stage and the B-stage in the 2D mode according to the example embodiment of the invention. As shown in FIGS. 9 and 11, the first and second start voltages VST1 and VST2 are generated, and the 6-phase clocks CLK1 to CLK6 are generated as cycle clocks, that are sequentially retarded in order from the first clock CLK1 to the sixth clock CLK6. FIG. 11 illustrates the second start voltage VST2, that is generated earlier than the first start voltage VST1 by four horizontal periods, but is not limited thereto. For example, the second start voltage VST2 may be generated earlier than the first start voltage VST1 by three horizontal periods to several tens of horizontal periods.

First, an operation of the kth A-stage $ST_A(k)$ is described below. It is assumed that the clock input to the clock terminal CLK of the kth A-stage $ST_A(k)$ is the fifth clock CLK5.

During periods T1 to T4, the Q node is held at the gate low voltage VGL, and the QB node is held at the gate high voltage VGH.

During a period T5, the first start voltage VST1 or the (2k–7)th output Gout(2k–7) as the start signal is input to the kth A-stage $ST_A(k)$ through the first input terminal VST. The first TFT T1 is turned on in response to the first start voltage VST1 or the (2k−7)th output Gout(2k−7). As a result, the Q node is charged to the gate high voltage VGH, and the QB node is discharged to the gate low voltage VGL.

During periods T6 and T7, the Q node is held at the gate high voltage VGH, and the QB node is held at the gate low voltage VGL.

During a period T8, the fifth gate shift clock CLK5 is applied to the drain electrode of the pull-up TFT TU. Because the Q node is bootstrapped due to the parasitic capacitance between the gate electrode and the drain electrode of the pull-up TFT TU, the voltage of the Q node increases to the voltage level VGH' greater than the gate high voltage VGH and turns on the pull-up TFT TU. Thus, the voltage of the output node NO increases to the gate high voltage VGH and rises the (2k−1)th gate pulse Gout(2k−1), and the QB node is held at the gate low voltage VGL.

During a period T9, because the fifth gate shift clock CLK5 is not applied to the drain electrode of the pull-up TFT TU, the voltage of the Q node is held at the gate high voltage VGH and the pull-up TFT TU is turned off. Thus, the (2k−1)th gate pulse Gout(2k−1) falls to the gate low voltage VGL, and the QB node is held at the gate low voltage VGL.

During a period T10, the Q node is held at the gate high voltage VGH, and the QB node is held at the gate low voltage VGL.

During a period T11, the first start voltage VST1 or the (2k+5)th output Gout(2k+5) as the reset signal is input to the kth A-stage $ST_A(k)$ through the second input terminal VRE-SET. The eighth TFT T8 is turned on in response to the first start voltage VST1 or the (2k+5)th output Gout(2k+5). As a result, the Q node is discharged to the gate low voltage VGL. Because the fourth TFT T4 and the fifth TFT T5 are turned off due to the discharging operation of the Q node, the QB node is charged to the power voltage VDD of the gate high voltage VGH applied through the sixth TFT T6. The pull-down TFT TD is turned on due to the charging operation of the QB node. Hence, the voltage of the output node NO falls to the gate low voltage VGL, and the (2k−1)th gate pulse Gout(2k−1) is held at the gate low voltage VGL.

Next, an operation of the kth B-stage $ST_B(k)$ is described. It is assumed that the clock input to the clock terminal CLK of the kth B-stage $ST_B(k)$ is the first clock CLK1.

During the period T1, the second start voltage VST2 or a (2k−6)th output Gout(2k−6) as the start signal is input to the kth B-stage $ST_B(k)$ through the first input terminal VST. The first TFT T1 is turned on in response to the second start voltage VST2 or the (2k−6)th output Gout(2k−6). As a result, the Q node is charged to the gate high voltage VGH, and the QB node is discharged to the gate low voltage VGL.

During the periods T2 and T3, the Q node is held at the gate high voltage VGH, and the QB node is held at the gate low voltage VGL.

During the period T4, the first gate shift clock CLK1 is applied to the drain electrode of the pull-up TFT TU. Because the Q node is bootstrapped due to the parasitic capacitance between the gate electrode and the drain electrode of the pull-up TFT TU, the voltage of the Q node increases to the voltage level VGH' greater than the gate high voltage VGH and turns on the pull-up TFT TU. Thus, the voltage of the output node NO increases to the gate high voltage VGH and rises the (2k)th gate pulse Gout(2k), and the QB node is held at the gate low voltage VGL.

During the period T5, because the first gate shift clock CLK1 is not applied to the drain electrode of the pull-up TFT TU, the voltage of the Q node is held at the gate high voltage VGH and the pull-up TFT TU is turned off. Thus, the (2k)th gate pulse Gout(2k) falls to the gate low voltage VGL, and the QB node is held at the gate low voltage VGL.

During the period T6, the Q node is held at the gate high voltage VGH, and the QB node is held at the gate low voltage VGL.

During the period T7, the second start voltage VST2 or the (2k+6)th output Gout(2k+6) as the reset signal is input to the kth B-stage $ST_B(k)$ through the second input terminal VRE-SET. The eighth TFT T8 is turned on in response to the second start voltage VST2 or the (2k+6)th output Gout(2k+6). As a result, the Q node is discharged to the gate low voltage VGL. Because the fourth TFT T4 and the fifth TFT T5 are turned off due to the discharging operation of the Q node, the QB node is charged to the power voltage VDD of the gate high voltage VGH applied through the sixth TFT T6. The pull-down TFT TD is turned on due to the charging operation of the QB node. Hence, the voltage of the output node NO falls to the gate low voltage VGL, and the (2k)th gate pulse Gout(2k) is held at the gate low voltage VGL.

During the periods T8 to T11, the Q node is held at the gate low voltage VGL, and the QB node is held at the gate high voltage VGH.

As shown in FIG. 11, in the 2D mode, each of the B-stages $ST_B(1)$ to $ST_B(n)$ outputs the gate pulse to the (2n)th gate lines. After three horizontal periods to several tens of horizontal periods passed, each of the A-stages $ST_A(1)$ to $ST_A(n)$ outputs the gate pulse to the (2n−1)th gate lines. In the 2D mode, the pixel electrode of the data display part 210 is charged to the data voltage due to the turn-on operation of the first scan TFT 211 of the data display part 210 as shown in FIG. 7A. Further, the third scan TFT 222 of the active black stripe part 220 is turned on. After three horizontal periods to several tens of horizontal periods passed, the second scan TFT 221 of the active black stripe part 220 is turned on. Therefore, the pixel electrode of the active black stripe part 220 is discharged to the common voltage and then is charged to the data voltage as shown in FIG. 7A. Thus, in the 2D mode, the data display part 210 and the active black stripe part 220 display the 2D image.

Further, in the 2D mode, when the kth B-stage $ST_B(k)$ does not operate as shown in FIG. 10, the QB node of the kth B-stage $ST_B(k)$ is continuously held at the gate high voltage VGH. Hence, the threshold voltage of the pull-down TFT TD connected to the QB node may shift because of a gate bias stress. Thus, when the kth B-stage $ST_B(k)$ operates in the 2D mode as shown in FIG. 11, the gate bias stress of the pull-down TFT TD connected to the QB node may be prevented.

FIG. 12 is a waveform diagram illustrating input and output signals of the A-stage and the B-stage in the 3D mode according to the example embodiment of the invention. As shown in FIGS. 9 and 12, the first and second start voltages VST1 and VST2 are generated, and the 6-phase clocks CLK1 to CLK6 are generated as cycle clocks, that are sequentially retarded in order from the first clock CLK1 to the sixth clock CLK6. FIG. 12 illustrates the first start voltage VST1, that is generated earlier than the second start voltage VST2 by four horizontal periods, but is not limited thereto. For example, the first start voltage VST1 may be generated earlier than the second start voltage VST2 by three horizontal periods to several tens of horizontal periods.

First, an operation of the kth A-stage $ST_A(k)$ is described below. It is assumed that the clock input to the clock terminal CLK of the kth A-stage $ST_A(k)$ is the first clock CLK1.

During a period T1, the first start voltage VST1 or the (2k−7)th output Gout(2k−7) as the start signal is input to the kth A-stage $ST_A(k)$ through the first input terminal VST. The first TFT T1 is turned on in response to the first start voltage VST1 or the (2k−7)th output Gout(2k−7). As a result, the Q node is charged to the gate high voltage VGH, and the QB node is discharged to the gate low voltage VGL.

During periods T2 and T3, the Q node is held at the gate high voltage VGH, and the QB node is held at the gate low voltage VGL.

During a period T4, the first gate shift clock CLK1 is applied to the drain electrode of the pull-up TFT TU. Because the Q node is bootstrapped due to the parasitic capacitance between the gate electrode and the drain electrode of the pull-up TFT TU, the voltage of the Q node increases to the voltage level VGH' greater than the gate high voltage VGH and turns on the pull-up TFT TU. Thus, the voltage of the output node NO increases to the gate high voltage VGH and rises the (2k−1)th gate pulse Gout(2k−1), and the QB node is held at the gate low voltage VGL.

During a period T5, because the first gate shift clock CLK1 is not applied to the drain electrode of the pull-up TFT TU, the voltage of the Q node is held at the gate high voltage VGH and the pull-up TFT TU is turned off. Thus, the (2k−1)th gate pulse Gout(2k−1) falls to the gate low voltage VGL, and the QB node is held at the gate low voltage VGL.

During a period T6, the Q node is held at the gate high voltage VGH, and the QB node is held at the gate low voltage VGL.

During a period T7, the first start voltage VST1 or the (2k+5)th output Gout(2k+5) as the reset signal is input to the kth A-stage $ST_A(k)$ through the second input terminal VRESET. The eighth TFT T8 is turned on in response to the first start voltage VST1 or the (2k+5)th output Gout(2k+5). As a result, the Q node is discharged to the gate low voltage VGL. Because the fourth TFT T4 and the fifth TFT T5 are turned off due to the discharging operation of the Q node, the QB node is charged to the power voltage VDD of the gate high voltage VGH applied through the sixth TFT T6. The pull-down TFT TD is turned on due to the charging operation of the QB node. Hence, the voltage of the output node NO falls to the gate low voltage VGL, and the (2k−1)th gate pulse Gout(2k−1) is held at the gate low voltage VGL.

During periods T8 to T11, the Q node is held at the gate low voltage VGL, and the QB node is held at the gate high voltage VGH.

Next, an operation of the kth B-stage $ST_B(k)$ is described below. It is assumed that the clock input to the clock terminal CLK of the kth B-stage $ST_B(k)$ is the fifth clock CLK5.

During the periods T1 to T4, the Q node is held at the gate low voltage VGL, and the QB node is held at the gate high voltage VGH.

During the period T5, the second start voltage VST2 or the (2k−6)th output Gout(2k−6) as the start signal is input to the kth B-stage $ST_B(k)$ through the first input terminal VST. The first TFT T1 is turned on in response to the second start voltage VST2 or the (2k−6)th output Gout(2k−6). As a result, the Q node is charged to the gate high voltage VGH, and the QB node is discharged to the gate low voltage VGL.

During the periods T6 and T7, the Q node is held at the gate high voltage VGH, and the QB node is held at the gate low voltage VGL.

During the period T8, the fifth gate shift clock CLK5 is applied to the drain electrode of the pull-up TFT TU. Because the Q node is bootstrapped due to the parasitic capacitance between the gate electrode and the drain electrode of the pull-up TFT TU, the voltage of the Q node increases to the voltage level VGH' greater than the gate high voltage VGH and turns on the pull-up TFT TU. Thus, the voltage of the output node NO increases to the gate high voltage VGH and rises the (2k)th gate pulse Gout(2k), and the QB node is held at the gate low voltage VGL.

During the period T9, because the fifth gate shift clock CLK5 is not applied to the drain electrode of the pull-up TFT TU, the voltage of the Q node is held at the gate high voltage VGH and the pull-up TFT TU is turned off. Thus, the (2k)th gate pulse Gout(2k) falls to the gate low voltage VGL, and the QB node is held at the gate low voltage VGL.

During the period T10, the Q node is held at the gate high voltage VGH, and the QB node is held at the gate low voltage VGL.

During the period T11, the second start voltage VST2 or the (2k+6)th output Gout(2k+6) as the reset signal is input to the kth A-stage $ST_A(k)$ through the second input terminal VRESET. The eighth TFT T8 is turned on in response to the second start voltage VST2 or the (2k+6)th output Gout(2k+6). As a result, the Q node is discharged to the gate low voltage VGL. Because the fourth TFT T4 and the fifth TFT T5 are turned off due to the discharging operation of the Q node, the QB node is charged to the power voltage VDD of the gate high voltage VGH applied through the sixth TFT T6. The pull-down TFT TD is turned on due to the charging operation of the QB node. Hence, the voltage of the output node NO falls to the gate low voltage VGL, and the (2k)th gate pulse Gout(2k) is held at the gate low voltage VGL.

As shown in FIG. 11, in the 2D mode, each of the B-stages $ST_B(1)$ to $ST_B(n)$ outputs the gate pulse to the (2n)th gate lines. After three horizontal periods to several tens of horizontal periods passed, each of the A-stages $ST_A(1)$ to $ST_A(n)$ outputs the gate pulse to the (2n−1)th gate lines. In the 2D mode, the pixel electrode of the data display part 210 is charged to the data voltage due to the turn-on operation of the first scan TFT 211 of the data display part 210 as shown in FIG. 7A. Further, the third scan TFT 222 of the active black stripe part 220 is turned on. After three horizontal periods to several tens of horizontal periods passed, the second scan TFT 221 of the active black stripe part 220 is turned on. Therefore, the pixel electrode of the active black stripe part 220 is discharged to the common voltage and then is charged to the data voltage as shown in FIG. 7A. Thus, in the 2D mode, the data display part 210 and the active black stripe part 220 display the 2D image.

As shown in FIG. 12, in the 3D mode, each of the A-stages $ST_A(1)$ to $ST_A(n)$ outputs the gate pulse to the (2n−1)th gate lines. After three horizontal periods to several tens of horizontal periods passed, each of the B-stages $ST_B(1)$ to $ST_B(n)$ outputs the gate pulse to the (2n)th gate lines. In the 3D mode, the pixel electrode of the data display part 210 is charged to the data voltage due to the turn-on operation of the first scan TFT 211 of the data display part 210 as shown in FIG. 7B. Further, the second scan TFT 221 of the active black stripe 220 is turned on. After three horizontal periods to several tens of horizontal periods passed, the third scan TFT 222 of the active black stripe part 220 is turned on. Therefore, the pixel electrode of the active black stripe part 220 is charged to the data voltage and then is discharged to the common voltage as shown in FIG. 7B. Thus, in the 3D mode, the data display part 210 displays the 3D image, and the active black stripe part 220 serves as the black stripe.

The stereoscopic image display according to the example embodiment of the invention controls the A-stages for supplying the gate pulse to the (2n−1)th gate lines connected to each of the data display part and the active black stripe part and the B-stages for supplying the gate pulse to the (2n)th gate lines connected to only the active black stripe part using the first and second start voltages, thereby implementing the active blacks stripe. As a result, because the stereoscopic image display according to the example embodiment of the invention does not require a gate driver IC, the manufacturing cost may be reduced. Further, the stereoscopic image display according to the example embodiment of the invention operates the B-stages in 2D mode, thereby preventing the gate bias stress of the transistor whose the gate electrode is connected to the Q node of the stage.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A stereoscopic image display comprising:
a display panel including a plurality of pixels each pixel including colored subpixels, wherein each of the subpixels include a data display part and an active black stripe part;
a data display unit configured to display an image in 2D mode and in 3D mode, wherein the data display unit comprises a first transistor, the first transistor supplying a 2D data voltage of a data line to a first pixel electrode of the data display unit in response to a gate pulse of a (2n-1)th gate line in a 2D mode and supplying a 3D data voltage of the data line to the first pixel electrode in response to the gate pulse of the (2n-1)th gate line in a 3D mode, where n is a natural number;
an active black stripe unit configured to enhance the image displayed by the data display unit in 2D mode and selectively display a black image in 3D mode, wherein the active black stripe unit comprises a second transistor and a third transistor, the second transistor supplying the 2D data voltage of the data line to a second pixel electrode of the active black stripe unit in response to the gate pulse of the (2n-1)th gate line in the 2D mode and supplying the 3D data voltage of the data line to the second pixel electrode in response to the gate pulse of the (2n-1)th gate line in the 3D mode, the third transistor being turned off in response to a low logic level voltage of a (2n)th gate line in the 2D mode and supplying a common voltage commonly applied to a common electrode to the second pixel electrode in response to a gate pulse of the (2n)th gate line in the 3D mode; and
a shift register including A-stages sequentially supplying the gate pulse to the (2n-1)th gate lines and B-stages sequentially supplying the gate pulse to the (2n)th gate lines.

2. The stereoscopic image display of claim 1, wherein the A-stages are cascade-connected to one another and sequentially supply the gate pulse to the (2n−1)th gate lines when the A-stages receive a first start voltage from a timing controller, wherein the B-stages are cascade-connected to one another and sequentially supply the gate pulse to the (2n)th gate lines when the B-stages receive a second start voltage from the timing controller.

3. The stereoscopic image display of claim 2, wherein the first start voltage is generated in both the 2D mode and the 3D mode.

4. The stereoscopic image display of claim 3, wherein the second start voltage is not generated in the 2D mode.

5. The stereoscopic image display of claim 3, wherein the second start voltage is generated earlier than the first start voltage by three horizontal periods to several tens of horizontal periods in the 2D mode.

6. The stereoscopic image display of claim 3, wherein the first start voltage is generated earlier than the second start voltage by three horizontal periods to several tens of horizontal periods in the 3D mode.

7. The stereoscopic image display of claim 2, wherein each of the A-stages includes a clock terminal receiving one of i-phase clocks, whose phases are sequentially retarded, where 'i' is a natural number equal to or greater than 3, a first input terminal receiving a start signal, and a second input terminal receiving a reset signal,
wherein the start signal is the first start voltage or a carry signal of a front stage, and the reset signal is the first start voltage or a carry signal of a rear stage.

8. The stereoscopic image display of claim 7, wherein each of the A-stages includes:
a Q node charging circuit configured to charge a Q node in response to the start signal;
a node controller configured to control charging and discharging operations of the Q node and a QB node;
a Q node discharging circuit configured to discharge the Q node in response to the reset signal; and
an output unit configured to output the gate pulse through an output node based on voltages of the Q node and the QB node.

9. The stereoscopic image display of claim 2, wherein each of the B-stages includes a clock terminal receiving one of i-phase clocks, whose phases are sequentially retarded, where 'i' is a natural number equal to or greater than 3, a first input terminal receiving a start signal, and a second input terminal receiving a reset signal,
wherein the start signal is the second start voltage or a carry signal of a front stage, and the reset signal is the second start voltage or a carry signal of a rear stage.

10. The stereoscopic image display of claim 9, wherein each of the B-stages includes:
a Q node charging circuit configured to charge a Q node in response to the start signal;
a node controller configured to control charging and discharging operations of the Q node and a QB node;
a Q node discharging circuit configured to discharge the Q node in response to the reset signal; and
an output unit configured to output the gate pulse through an output node based on voltages of the Q node and the QB node.

11. The stereoscopic image display of claim 2, wherein i-phase clocks, whose phases are sequentially retarded, is received from the timing controller, where 'i' is a natural number equal to or greater than 3,
wherein voltages of the i-phase clocks level level-shift to a gate high voltage and a gate low voltage less than the gate high voltage.

12. A method for driving a stereoscopic image display comprising:
supplying a 2D data voltage of a data line to a pixel electrode of a data display part and a pixel electrode of an active black stripe part in response to a gate pulse of a (2n-1)th gate line in a 2D mode, where n is a natural number;

supplying a 3D data voltage of the data line to the pixel electrode of the data display part and the pixel electrode of the active black stripe part in response to the gate pulse of the (2n-1)th gate line in a 3D mode;

supplying a common voltage commonly applied to a common electrode to the pixel electrode of the active black stripe part in response to a gate pulse of the (2n)th gate line in the 3D mode; and sequentially supplying the gate pulse to the (2n-1)th gate lines and sequentially supplying the gate pulse to the (2n)th gate lines.

* * * * *